United States Patent [19]
Braun

[11] 3,958,175
[45] May 18, 1976

[54] CURRENT LIMITING SWITCHING CIRCUIT

[75] Inventor: Arthur Rechtman Braun, Naperville, Ill.

[73] Assignee: Bell Telephone Laboratories, Incorporated, Murray Hill, N.J.

[22] Filed: Dec. 16, 1974

[21] Appl. No.: 533,344

[52] U.S. Cl. ............................ 323/9; 307/311; 323/21
[51] Int. Cl.² ............................................. G05F 3/14
[58] Field of Search ............... 307/311; 323/1, 4, 9, 323/21

[56] References Cited
UNITED STATES PATENTS

| | | |
|---|---|---|
| 3,424,972 | 1/1969 | Ekstrom et al................ 323/21 UX |
| 3,476,941 | 11/1969 | Bonin............................ 307/311 X |
| 3,535,532 | 10/1970 | Merryman..................... 307/311 UX |
| 3,546,564 | 12/1970 | Denny............................ 323/1 |
| 3,769,572 | 10/1973 | Doubt............................. 323/4 |
| 3,836,793 | 9/1974 | Haitz et al..................... 307/311 X |
| 3,838,224 | 9/1974 | Richards........................ 179/18 AH |

Primary Examiner—A. D. Pellinen
Attorney, Agent, or Firm—James W. Falk; John C. Albrecht

[57] ABSTRACT

A current limiting switching circuit which has general application and which comprises a photoresponsive semiconductor circuit activated by a light emitting diode. A semiconductor device is included for regulating the base drive of a transistor in the photoresponsive semiconductor circuit to maintain a constant collector current flow therein.

8 Claims, 3 Drawing Figures

CURRENT LIMITING SWITCHING CIRCUIT

FIELD OF THE INVENTION

This invention relates to current limiting switching circuits.

BACKGROUND OF THE INVENTION

There are a variety of applications in which it is desirable to limit the flow of current to conserve power. For example, continuous direct current flow between two remote stations indicates the supervisory states of the two stations. Interruptions in the current flow are used to send information from one station to the other. To avoid custom design for every installation, terminal apparatus must be capable of operation with interconnecting transmission paths of different resistances. Equipment is designed so that for a maximum resistance path the current flow in the path will be the minimum required for reliable activation of the sensing elements utilized in the equipment. Installations having less than this maximum resistance path between stations will allow more current to flow than is necessary, accordingly, power is wasted. Interruptions in the direct current flow can be provided by metallic contact devices or by solid state devices. Factors such as size, cost, circuit isolation, and long life favor the use of solid state devices.

SUMMARY OF THE INVENTION

In accordance with my invention a current limiting switching circuit comprises photoresponsive semiconductor means including a controlled transistor in combination with semiconductor regulating circuitry which in response to current flow establishes a fixed control potential to limit the base drive of the controlled transistor to establish a selected magnitude of current flow in the circuit. The current limiting circuit is placed in the conducting state by the application of light to the photoresponsive semiconductor means.

Advantageously, the semiconductor circuitry for establishing the fixed control potential comprises a transistor or a diode device. When a transistor is used the control potential equals the base emitter junction voltage of the transistor and when a diode device is used the control voltage equals the voltage of the diode device less a transistor base emitter junction voltage.

Advantageously, my circuit may be switched between conducting and nonconducting states by the application of light under control of a circuit which is isolated from the current limiting circuit.

Advantageously, my circuit requires no internal source of power since the control potential is established by the current being limited.

BRIEF DESCRIPTION OF THE DRAWING

The invention will be understood from the following detailed description when read with reference to the drawing in which.

DETAILED DESCRIPTION

Figure 1:
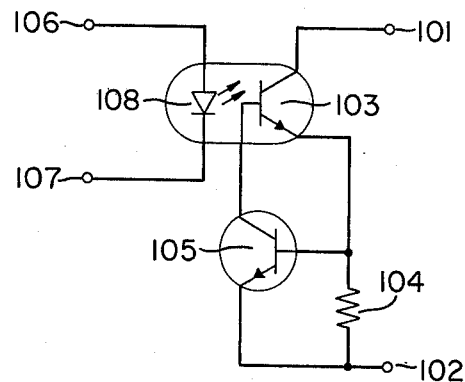
FIG. 1 is a schematic diagram showing a current limiting circuit.

A current limiting circuit according to my invention is shown in FIG. 1. Current flow is unidirectional from terminal 101 to terminal 102 through photoresponsive transistor 103 and resistor 104. Transistor 105 is connected so that its base emitter junction shunts resistor 104 and its collector is connected to the base of transistor 103. If current flows through transistor 103 and resistor 104, a voltage will be generated across resistor 104. That voltage activates transistor 105 thereby reducing the base drive for transistor 103 which in turn tends to reduce the voltage across resistor 104. This interaction continues and the voltage across resistor 104 stabilizes to the base emitter voltage drop of transistor 105 and a constant current flow is maintained through the circuit.

Terminals 106 and 107 are connected respectively to the anode and cathode of light emitting diode 108 which is optically coupled to transistor 103. By applying a potential source across terminals 106 and 107 such that terminal 106 is sufficiently positive relative to terminal 107, diode 108 will emit light which activates transistor 103.

If an external source of potential is connected across terminals 101 and 102 so that terminal 101 is several volts more positive than terminal 102 and transistor 103 is active due to light emission from diode 108, current will flow through transistor 103 and resistor 104. The current which flows through transistor 103 and resistor 104 is controlled by the fixed voltage which is maintained across resistor 104 by transistor 105. Transistor 105 regulates the base drive to transistor 103 to maintain the fixed potential across resistor 104. This voltage and the resistance value of resistor 104 fix the current which will flow through the circuit.

Figure 2:
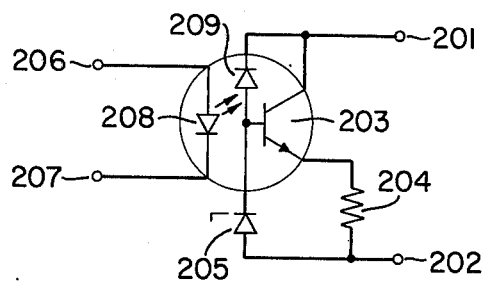
FIG. 2 is a second embodiment of my current limiting circuit.

FIG. 2 shows a second embodiment of my invention which operates substantially the same as the circuit of FIG. 1. Zener diode 205 regulates the base drive of transistor 203 and thereby maintains a fixed potential across resistor 204 to fix the current which will flow through the circuit. Transistor 203 is controlled by photoresponsive diode 209 which is optically coupled to light-emitting diode 208 so that when diode 208 emits light transistor 203 is active.

Figure 3:
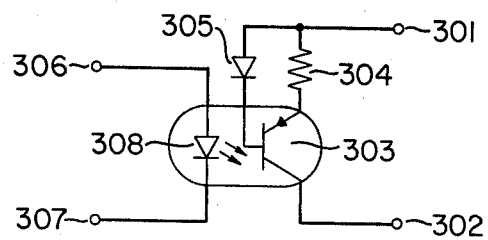
FIG. 3 is a third embodiment of my current limiting circuit.

FIG. 3 shows a third embodiment of my invention which operates substantially the same as the circuits of FIG. 1 and 2. In FIG. 3, diode 305 controls the base drive of transistor 303 and thereby maintains a fixed potential across resistor 304 to fix the current which will flow through the circuit.

What is claimed is:
1. A current limiting circuit comprising:
   first and second terminals;
   photoresponsive means comprising a first transistor of one conductivity type having base, emitter, and collector terminals;
   means coupling said first terminal to said collector terminal of said first transistor;
   resistance means coupling said emitter terminal of said first transistor to said second terminal;
   semiconductor means connected to said base terminal and said second terminal for regulating the base drive of said first transistor to limit the current flow in said circuit to a selected value; and
   controllable light-emitting means light coupled to said photoresponsive means for switching said first transistor to a conducting state.

2. A current limiting circuit in accordance with claim 1 wherein said semiconductor regulating means comprises:
- a second transistor of said one conductivity type having base, emitter, and collector terminals;
- said emitter terminal of said second transistor connected to said second terminal;
- said collector terminal of said second transistor connected to said base terminal of said first transistor; and
- means coupling said base terminal of said second transistor to said emitter terminal of said first transistor.

3. A current limiting circuit in accordance with claim 1 wherein said semiconductor regulating means comprises at least one diode which, when forward biased, conducts current between said base terminal and said second terminal in the same direction as the series combination of said resistance means and the emitter base junction of said first transistor when said emitter base junction is forward biased.

4. A current limiting circuit in accordance with claim 1 wherein said regulating means comprises a zener diode which, when forward biased, conducts current between said base terminal and said second terminal in the opposite direction as the series combination of said resistance means and the emitter base junction of said first transistor when said emitter base junction is forward biased.

5. The combination in accordance with claim 1 wherein said light-emitting means comprises a light-emitting diode.

6. The combination in accordance with claim 1 wherein said first transistor in said photoresponsive means is photoresponsive.

7. The combination in accordance with claim 1 wherein said photoresponsive means further comprises a photoresponsive diode connected in parallel with the base collector junction of said first transistor and poled between said base terminal and said collector terminal the same as said base collector junction.

8. A current limiting switching circuit for limiting the current flow in the circuit between first and second terminals to a specific magnitude comprising:
- photoresponsive means including a transistor having base, emitter, and collector terminals, said collector terminal being connected to the first terminal;
- a resistor connecting said emitter terminal to the second terminal;
- semiconductor means connected between said base terminal and the second terminal for regulating the base drive of said transistor to limit the current flow in said circuit to the specific magnitude; and
- controllable light-emitting means light coupled to said photoresponsive means for switching said transistor to a conducting state.

* * * * *